(12) United States Patent
Lee (10) Patent No.: US 9,030,084 B2
(45) Date of Patent: May 12, 2015

(54) LIGHT SOURCE DEVICE OF BACKLIGHT MODULE AND LIGHT-EMITTING DIODE PACKAGE STRUCTURE OF THE LIGHT SOURCE DEVICE

(75) Inventor: Tsung-Chi Lee, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 568 days.

(21) Appl. No.: 13/190,609

(22) Filed: Jul. 26, 2011

(65) Prior Publication Data

US 2012/0139404 A1 Jun. 7, 2012

(30) Foreign Application Priority Data

Dec. 2, 2010 (CN) ...................... 2010 2 0644846 U (51) Int. Cl.
*H01J 7/24* (2006.01)
*H01L 33/62* (2010.01)
*H01L 33/64* (2010.01)
*H01L 33/48* (2010.01)
*G02F 1/1335* (2006.01)

(52) U.S. Cl.
CPC .............. *H01L 33/62* (2013.01); *H01L 33/486* (2013.01); *H01L 33/647* (2013.01); *G02F 1/133615* (2013.01); *G02F 2001/133628* (2013.01); *H01L 2924/0002* (2013.01)

(58) Field of Classification Search
CPC ........ H01L 33/62; H01L 33/64; H01L 33/486
USPC .............. 362/97.1, 97.2, 606, 607, 633, 547; 257/99; 313/46
See application file for complete search history.

(56) References Cited

U.S. PATENT DOCUMENTS

| | | | |
|---|---|---|---|
| 2008/0180972 A1* | 7/2008 | Sakamoto et al. | 362/613 |
| 2009/0034291 A1* | 2/2009 | Nakamura | 362/613 |
| 2009/0179219 A1* | 7/2009 | Kim et al. | 257/99 |
| 2009/0303747 A1* | 12/2009 | Chen | 362/633 |
| 2010/0001308 A1* | 1/2010 | Park et al. | 257/99 |
| 2011/0286241 A1* | 11/2011 | Pan et al. | 362/607 |

* cited by examiner

*Primary Examiner* — Karabi Guharay
(74) *Attorney, Agent, or Firm* — Rosenberg, Klein & Lee (57) ABSTRACT

A light source device of a backlight module includes a back frame unit and a light-emitting diode (LED) package structure. The back frame unit includes a thermal conductive base plate, and a casing part having a first plate spaced apart from and parallel to the base plate. The LED package structure is disposed between the base and first plates, and includes a package body having a light-emitting surface, and two lateral surfaces respectively facing the base plate and the first plate. A lead frame unit includes a lead frame partially exposed from the lateral surfaces of the package body to form first and second heat-conducting paths with the base and first plates, respectively.

17 Claims, 13 Drawing Sheets

LIGHT SOURCE DEVICE OF BACKLIGHT MODULE AND LIGHT-EMITTING DIODE PACKAGE STRUCTURE OF THE LIGHT SOURCE DEVICE

CROSS REFERENCE TO RELATED APPLICATION

This application claims priority of Chinese Application No. 201020644846.6, filed on Dec. 2, 2010.

BACKGROUND OF THE INVENTION

1. Field of the Invention

The invention relates to a light source device of a backlight module, and more particularly to a heat-dissipating structure of a light source device of a backlight module and a light-emitting diode (LED) package structure of the light source device.

2. Description of the Related Art

Figure 1:
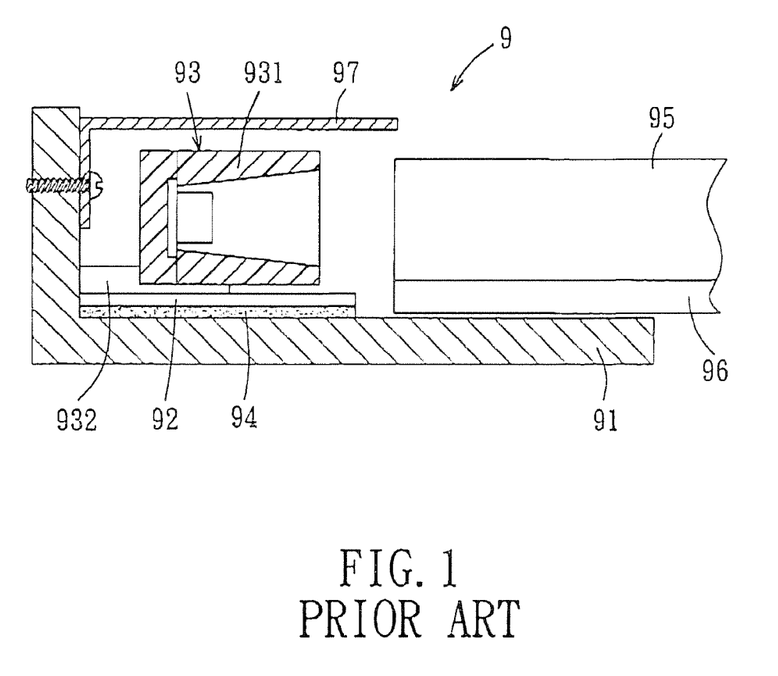
FIG. 1 is a sectional view of a conventional light source device of a backlight module.

Referring to FIG. 1, a conventional light source device 9 of a backlight module includes a thermal conductive frame 91, a circuit board 92, a light-emitting diode 93, and a thermal conductive material 94. The thermal conductive frame 91 can hold optical components, such as a light-guiding plate 95 and a reflective plate 96. The light-emitting diode 93 is soldered fixedly to the circuit board 92, and is disposed on the thermal conductive frame 91. The thermal conductive material 94 is disposed between the circuit board 92 and the thermal conductive frame 91. A reflective shade 97 is fastened to the thermal conductive frame 91, and is not in contact with the light-emitting diode 93.

Since the light-emitting diode 93 only has one side of a plastic seat body 931 soldered to the circuit board 92 through a guide pin 932 and is in contact with the thermal conductive frame 91 through the thermal conductive material 94, heat generated by the light-emitting diode 93 is dissipated via heat conduction through the circuit board 92, the thermal conductive material 94, and the thermal conductive frame 91. Such a heat dissipation mechanism still has room for improvement.

SUMMARY OF THE INVENTION

Therefore, the object of this invention is to provide a light source device of a backlight module and an LED package structure of the light source device that can increase heat-conducting paths to enhance a heat-dissipation effect.

According to one aspect of this invention, a light source device of a backlight module comprises a back frame unit and an LED package structure. The back frame unit includes a thermal conductive base plate, and a casing part disposed on the base plate and including a first plate spaced apart from the base plate. The LED package structure is disposed between the base plate and the first plate, and includes a package body, and a lead frame unit. The package body has a light-emitting surface and two lateral surfaces that are connected respectively to two opposite sides of the light-emitting surface and that are respectively facing the base plate and the first plate. The lead frame unit includes at least one lead frame packaged by the package body. The lead frame is partially exposed from the lateral surfaces of the package body to form a first heat-conducting path with the base plate and to form a second heat-conducting path with the first plate.

According to another aspect of this invention, an LED package structure of a light source device for mounting between a base plate and a first plate that is spaced apart from and parallel to the base plate comprises a package body, a lead frame unit, and an LED chip. The package body has a light-emitting surface, and two opposite lateral surfaces. The light-emitting surface is formed with an encapsulant cavity. The lead frame unit includes at least one lead frame packaged by the package body. The lead frame is partially exposed from the lateral surfaces of the package body to form a first heat-conducting path with the base plate and to form a second heat-conducting path with the first plate. The LED chip is mounted fixedly to the lead frame, and is disposed in the cavity.

The advantage of this invention resides in the fact that through the structural improvement of the lead frame unit of the LED package structure and/or the casing part of the back frame unit, when the LED package structure is mounted on the back frame unit, a plurality of heat-conducting paths can be formed to enhance the heat dissipation effect of the LED chip.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

The above-mentioned and other technical contents, features, and effects of this invention will be clearly presented from the following detailed description of the four preferred embodiments in coordination with the reference drawings.

Before this invention is described in detail, it should be noted that, in the following description, similar elements are designated by the same reference numerals.

Referring to FIGS. 2 to 6, a light source device 100 of a backlight module according to the first preferred embodiment of this invention is shown to comprise a back frame unit 1, a circuit board unit 2, first and second light-emitting diode (LED) package structures 3, 3', and two thermal pads 4.

Figure 3:
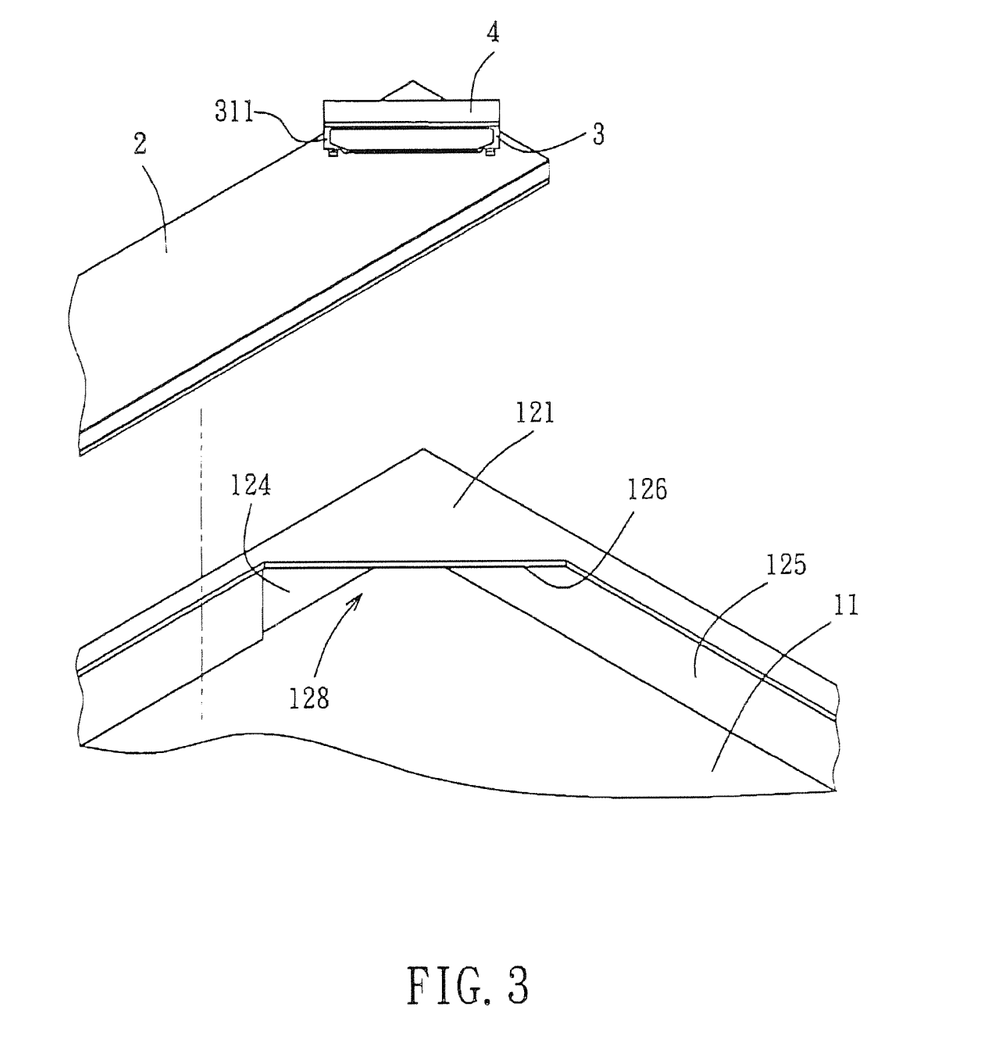
FIG. 3 is a fragmentary enlarged exploded perspective view of the first preferred embodiment.
Figure 4:
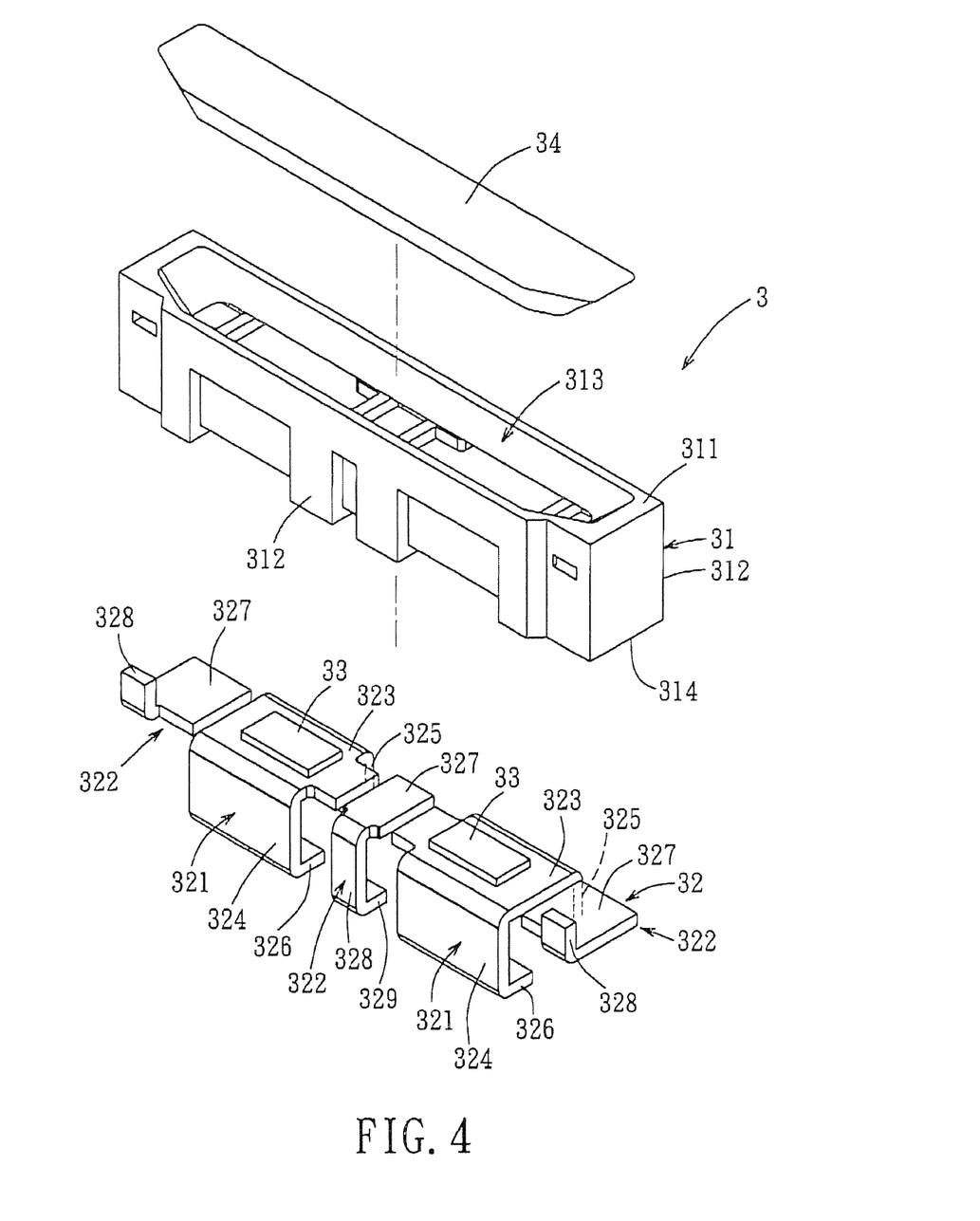
FIG. 4 is an exploded perspective view of an LED package structure of the first preferred embodiment.
Figure 5A:
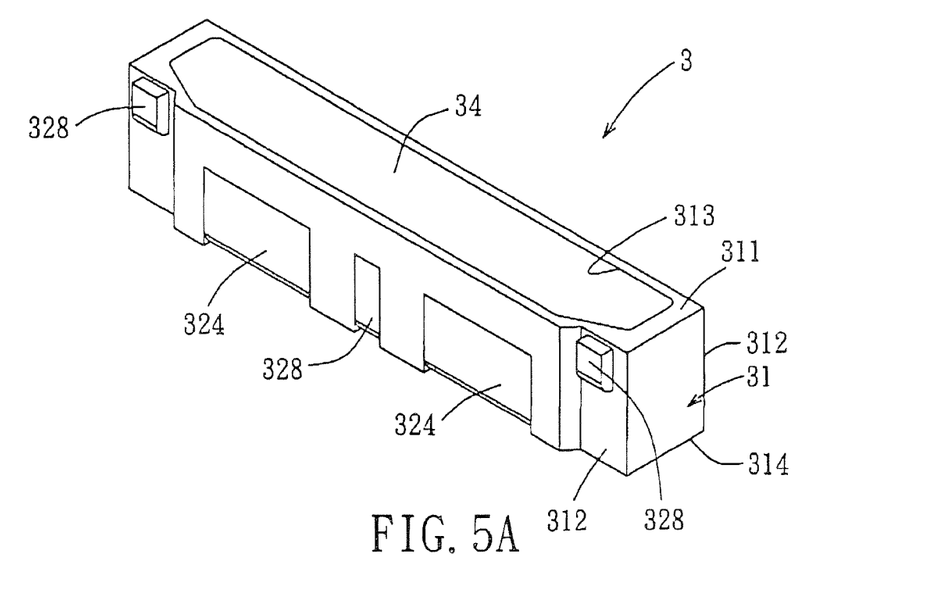
FIGS. 5A to 5C are perspective views of the LED package structure of the first preferred embodiment in an assembled state in different angles, respectively.
Figure 5B:
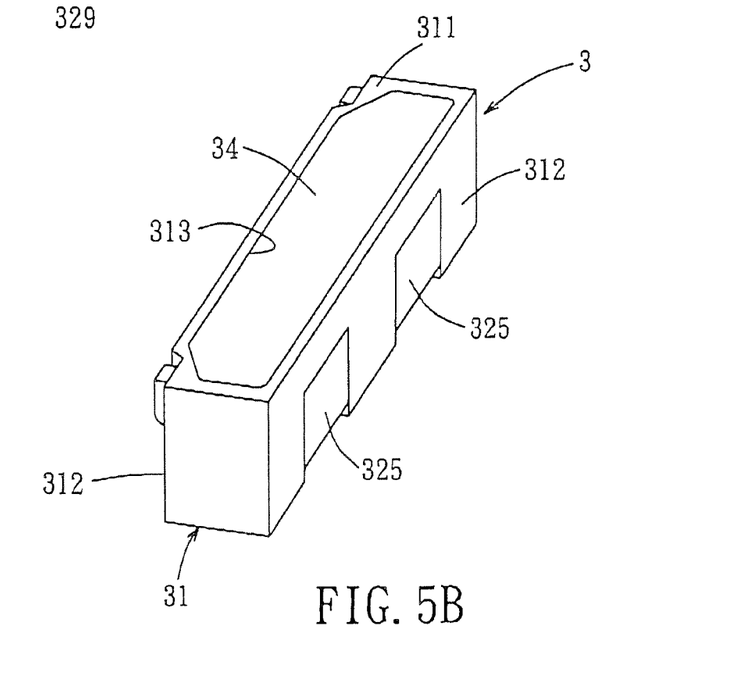
Figure 5C:
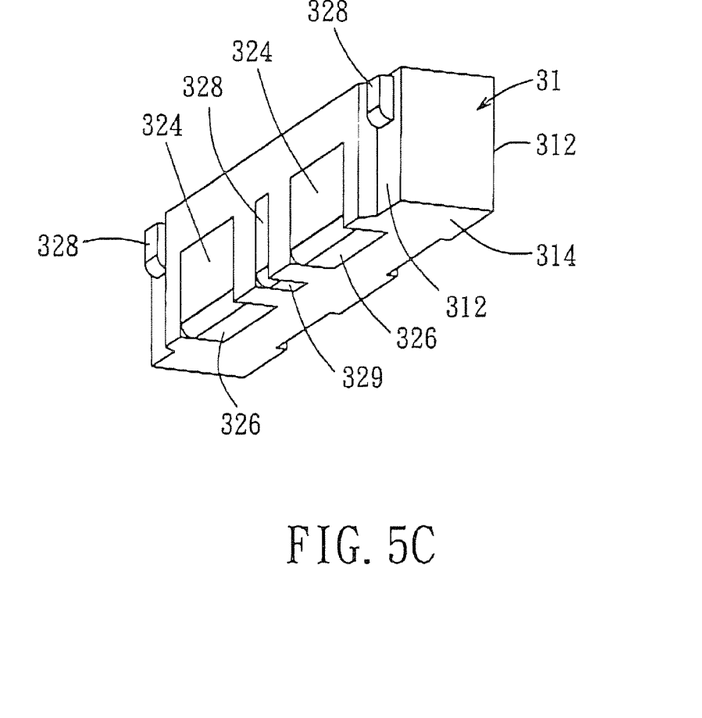
Figure 6:
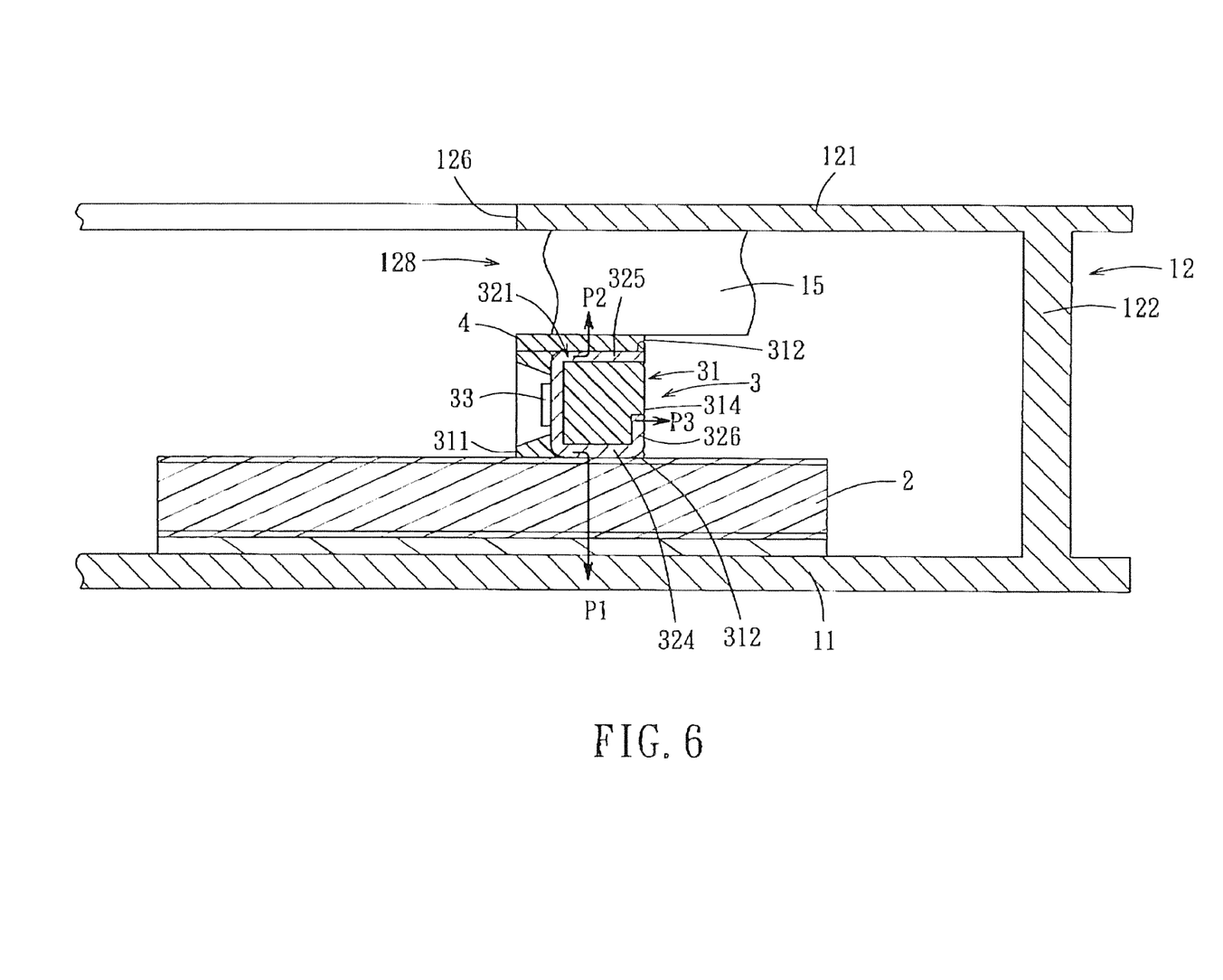
FIG. 6 is a sectional view of the first preferred embodiment in the assembled state.

With reference to FIGS. 3 and 4, the back frame unit 1 is made of metal, and includes a thermal conductive base plate 11 and a casing part 12. The base plate 11 is adapted to hold optical components such as a light-guiding plate, a light-diffusing plate, etc. The casino part 12 is disposed on the base plate 11, and includes a connecting plate 122, and two spaced-apart first and second plates 121, 123. The connecting plate 122, in this embodiment, is configured as a rectangular loop, and includes a pair of first connecting sides 124, 124', and a pair of second connecting sides 125, 125' connected between the first connecting sides 124, 124'. The first plate 121 is spaced apart from and parallel to the base plate 11, and is disposed at a corner between and is connected to the first connecting side 124 and the second connecting side 125. The first and second connecting sides 124, 125 connect the first plate 121 to the base plate 11. The second plate 123 is spaced apart from and parallel to the base plate 11, and is disposed at a corner between and is connected to the first connecting side 124 and the second connecting side 125'. The first and second connecting sides 124, 125' connect the second plate 123 to the base plate 11. Each of the first and second plates 121, 123 is a right-angled triangular plate, and has a slanting side 126, 127. The slanting side 126 of the first plate 121 forms an angle of 45° with respect to the first connecting side 124 and the second connecting side 125. The slanting side 127 of the second plate 123 forms an angle of 45° with respect to the first connecting side 124 and the second connecting side 125'. The slanting side 126, 127 of each of the first and second plates 121, 123 cooperates with the base plate 11 to define an opening 128 (only the opening 128 defined by the slanting side 126 and the base plate 11 is shown in FIGS. 3 and 6).

The circuit board unit 2 is mounted on the base plate 11, and has two opposite end portions each extending between the base plate 11 and a respective one of the first and second plates 121, 123.

Each of the first and second LED package structures 3, 3' is disposed between the base plate 11 and the respective one of the first and second plates 121, 123. Each of the first and second LED package structures 3, 3' extends along a slanting direction of the slanting side 126, 127 of the respective one of the first and second plates 121, 123, such that a light-emitting direction of each of the first and second LED package structures 3, 3' is toward a central region of the base plate 11, and forms an included angle of 45° with respect to the second connecting side 125, 125'. In actual practice, the slanting side 126, 127 of each of the first and second plates 121, 123 forming an included angle ranging from 30° to 90° with respect to the second connecting side 125, 125' is allowed. Hence, in another embodiment, when the slanting side 126, 127 of each of the first and second plates 121, 123 forms an angle of 90 degrees with respect to the second connecting side 125, 125', the slanting side 126, 127 is parallel to the first connecting side 124. This actual embodiment may be similar to the back frame of the conventional backlight module that receives therein an elongated type LED light source (that is, a plurality of LED package structures connected in an array on the base plate 11 oppositely facing the first connecting side 124 and emitting light toward the base plate 11). That is, the first and second plates 121, 123 are connected integrally as one single plate that cooperates with the base plate 11 and the first connecting side 124 to form an elongated groove for receiving therein the elongated type LED light source. Under this circumstance, a plurality of LED package structures may be disposed between the single plate and the base plate 11, and is not limited to only two LED package structures.

With reference to FIGS. 4, 5A to 5C, in this embodiment, since the structures of the first and second LED package structures 3, 3' are generally the same, only the structure of the first LED package structure 3 will be described below. The first LED package structure 3 includes an elongated package body 31, a lead frame unit 32, a plurality of LED chips 33, and a light-transmissive encapsulant 34. The package body 31 has a light-emitting surface 311, and two first lateral surfaces 312 respectively connected to two opposite sides of the light-emitting surface 311 and respectively facing the circuit board unit 2 and the first plate 121. The light-emitting surface 311 is formed with an elongated encapsulant cavity 313.

The lead frame unit 32 includes a plurality of lead frames 321 and a plurality of frame bodies 322 disposed in a staggered arrangement. That is, each lead frame 321 is disposed between each two adjacent ones of the frame bodies 322. Each lead frame 321 has a substantially U-shaped cross section, and includes a chip-mounting portion 323, first and second side portions 324, 325 extending respectively from two opposite sides of the chip-mounting portion 323, and a flange 326 extending from the first side portion 324 toward the second side portion 325 and spaced apart from the chip-mounting portion 323. Each frame body 322 includes a first plate portion 327, and a second plate portion 328 connected transversely to the first plate portion 327. As shown in FIG. 4, the second plate portions 328 of two of the frame bodies 322 extend upwardly from the corresponding first plate portions 327, while the second plate portion 328 of a third one of the frame bodies 322 extends downwardly from the corresponding first plate portion 327. The third frame body 322 further includes a flange 329 extending transversely from the second plate portion 328 thereof and spaced apart from and disposed below the first plate portion 327 thereof.

The lead frame unit 32 is packaged in the package body 31 such that the chip-mounting portions 323 of the lead frames 321 is disposed within the encapsulant cavity 313 and faces the light-transmissive encapsulant 34, the first and second side portions 329, 325 of the lead frames 321 are respectively exposed from the first lateral surfaces 312 of the package body 31, the second plate portions 328 of the frame bodies 322 are exposed from one of the first lateral surfaces 312 of the package body 31, and the flanges 326, 329 of the lead frames 321 and the frame bodies 322 are exposed from a second lateral surface 314 of the package body 31 that is opposite to the light-emitting surface 311.

The LED chips 33 are respectively mounted fixedly to the chip-mounting portions 323 of the lead frames 321, and are located within the encapsulant cavity 313 of the package body 31. Light emitted by each LED chip 33 passes through the light-emitting surface 311 via the encapsulant cavity 313. The light-transmissive encapsulant 34 is disposed in the encapsulant cavity 313 to seal the same.

Figure 2:
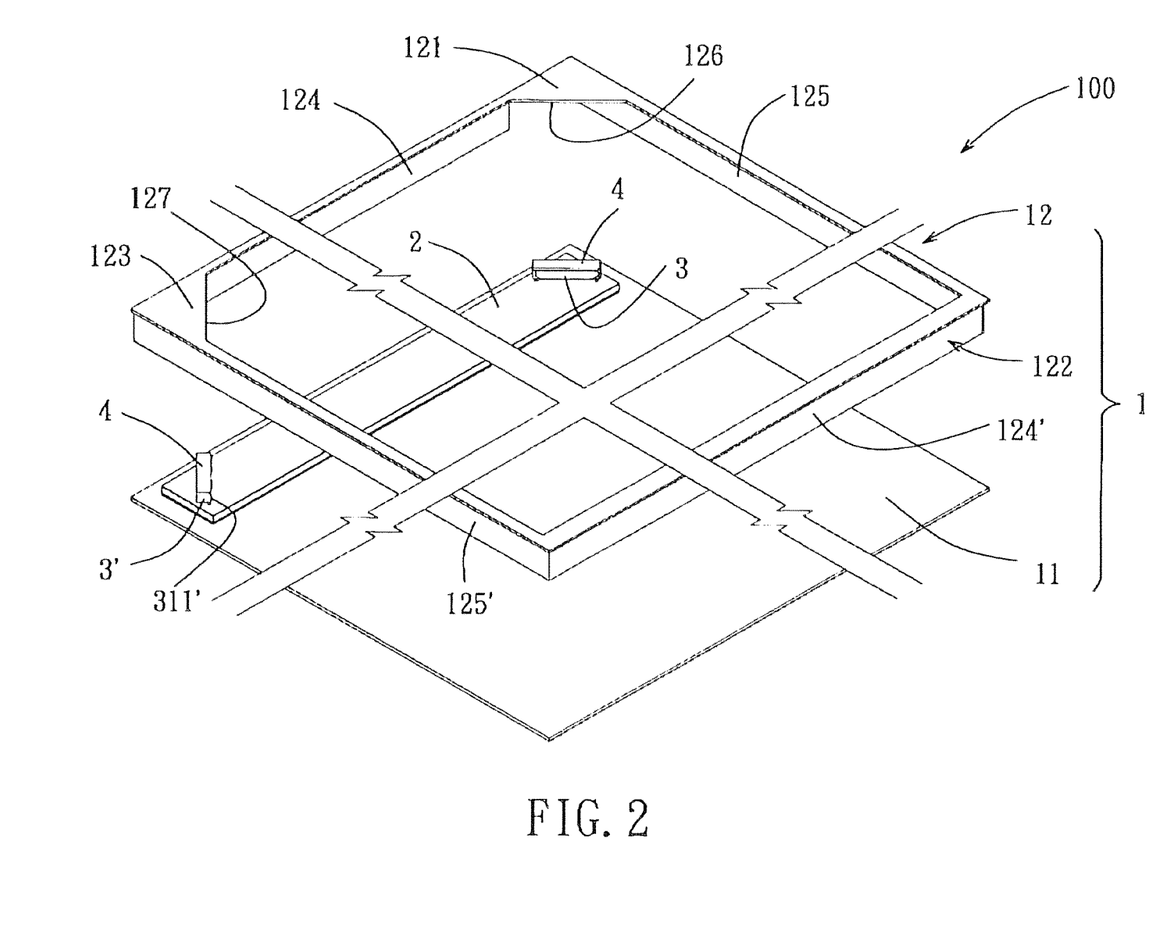
FIG. 2 is a fragmentary partially exploded perspective view of a light source device of a backlight module according to the first preferred embodiment of the present invention.

With reference to FIG. 6, the first LED package structure 3 is fixed to the circuit board unit 2 by soldering fixedly the exposed first side portions 324 of the lead frames 321 and the exposed second plate portions 328 of the frame bodies 322 to the circuit board unit 2 (for example by using solder paste), and is located between the base plate 11 and the first plate 121. As such, a first heat-conducting path (P1) is formed from the first side portion 324 and the second plate portion 328 (not visible in FIG. 6) through the circuit board unit 2 to the base plate 11. Further, the light-emitting surface 311 of the first LED package structure 3 is perpendicular to a plane where the circuit board unit 2 is situated, and faces the opening 128. When the first LED package structure 3 is disposed between the base plate 11 and the first plate 121, the light-emitting surface 311 is aligned with the slanting side 126 of the first plate 121. With reference to FIG. 2, the second LED package structure 3' also has a light-emitting surface. When the second LED package structure 3' is disposed between the base plate 11 and the second plate 123, the light-emitting surface of the second LED package structure 3' is also aligned with the slanting side 127 of the second plate 123. Hence, light emitted by each of the first and second LED package structures 3, 3' is facing toward the central region of the base plate 11, and is not blocked either by the first plate 121 or the second plate 123.

In this embodiment, the light-emitting surface 311 of the first LED package structure 3 is aligned with the slanting side 126 of the first plate 121. In an alternative embodiment, other configuration of the first LED package structure is allowed as long as the slanting side 126 of the first plate 121 does not extend beyond the light-emitting surface 311 of the package body 31 which can block the light emitted by the first LED package structure 3. In the aforesaid other embodiments, since the first and second plates 121, 123 may be connected integrally as a single plate, an edge of the single plate that is distal from the first connecting side is parallel with the first connecting side 124, and is simultaneously parallel with and does not extend beyond the light-emitting surfaces 311 of some of the first LED package structures.

Taking similarly the first LED package structure 3 as an example, the thermal pad 4 is disposed between the first LED package structure 3 and the first plate 121, and has one side contacting directly the exposed second side portions 325 of the lead frames 321, and the other side contacting directly another frame unit 15 of the backlight module. The frame unit 15 is disposed between the first plate 121 and the thermal pad 4. A second heat-conducting path (P2) is formed from the second side portions 325 through the thermal pad 4 to the first plate 121. In an alternative embodiment, the thermal pad 4 may be in direct contact with the first plate 121, and the frame unit 15 is dispensed with.

Therefore, taking the first LED package structure 3 as the example, through the structural improvement of the lead frames 321 and the frame bodies 322 of the first LED package structure 3 and the provision of the thermal pad 4, when the LED chips 33 of the first LED package structure 3 operate, heat generated by the LED chips 33 not only can be dissipated through the first heat-conducting path (P1) formed by the first side portions 324 and the second plate portions 329, the circuit board unit 2, and the base plate 11 of the back frame unit 1, but also can be dissipated through the second heat-conducting path (P2) formed by the second side portions 325, the thermal pad 4, and the first plate 121 of the back frame unit 1 (or plus the other frame unit 15 of the backlight module). Hence, a plurality of heat-conducting paths can be formed between the first LED package structure 3 and the back frame unit 1 to lower a junction temperature, thereby enhancing the heat dissipation effect of the first LED package structure 3.

Moreover, since the flanges 326, 329 of the lead frames 321 and the frame body 322 are exposed from the second lateral surface 314 of the package body 31, the structural design of the back frame unit 1 may be modified such that the first and second connecting sides 124, 125 of the back frame unit 1 can contact directly the flanges 326, 329 of the lead frames 321 and the frame bodies 322, or other heat-conductive material may be disposed between and in direct contact with the second lateral surface 314 of the package body 31 and one of the first and second connecting sides 124, 125 of the back frame unit 1 to provide a third heat-conducting path (P3) for further enhancing the heat dissipation effect of the first LED package structure 3.

Additionally, apart from serving as a heat-conducting medium between the first or second LED package structure 3, 3' and the back frame unit 1, the thermal pad 4, which is usually made of silicone rubber having a resiliency, can also be used to compensate for assembly errors between the first LED package structure 3 and the first plate 121 or between the second LED package structure 3' and the second plate 123, so that damage to the first and second LED package structures 3, 3' during assembly can be prevented.

Figure 7:
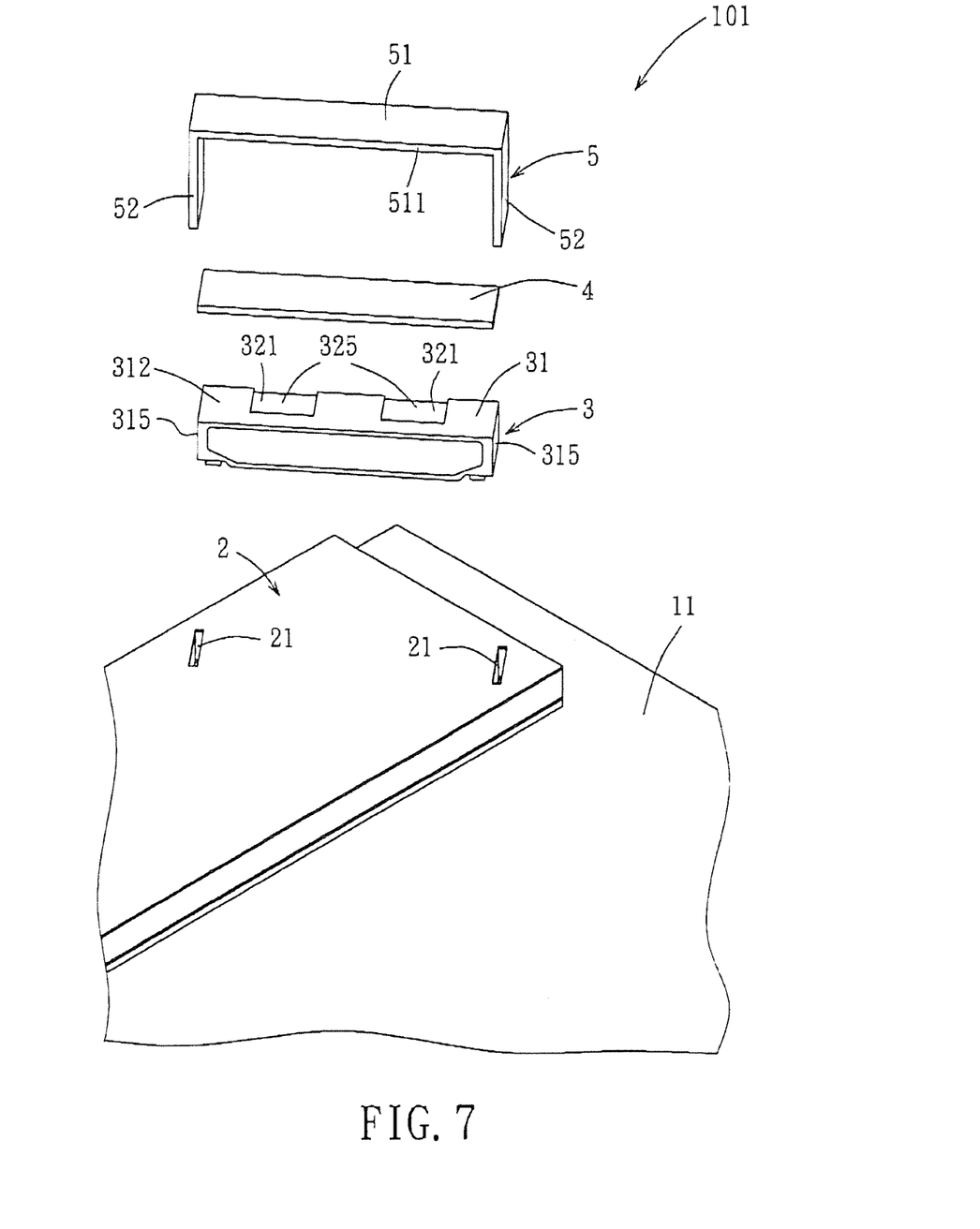
FIG. 7 is a fragmentary partially exploded perspective view of a light source device of a backlight module according to the second preferred embodiment of the present invention.
Figure 8:
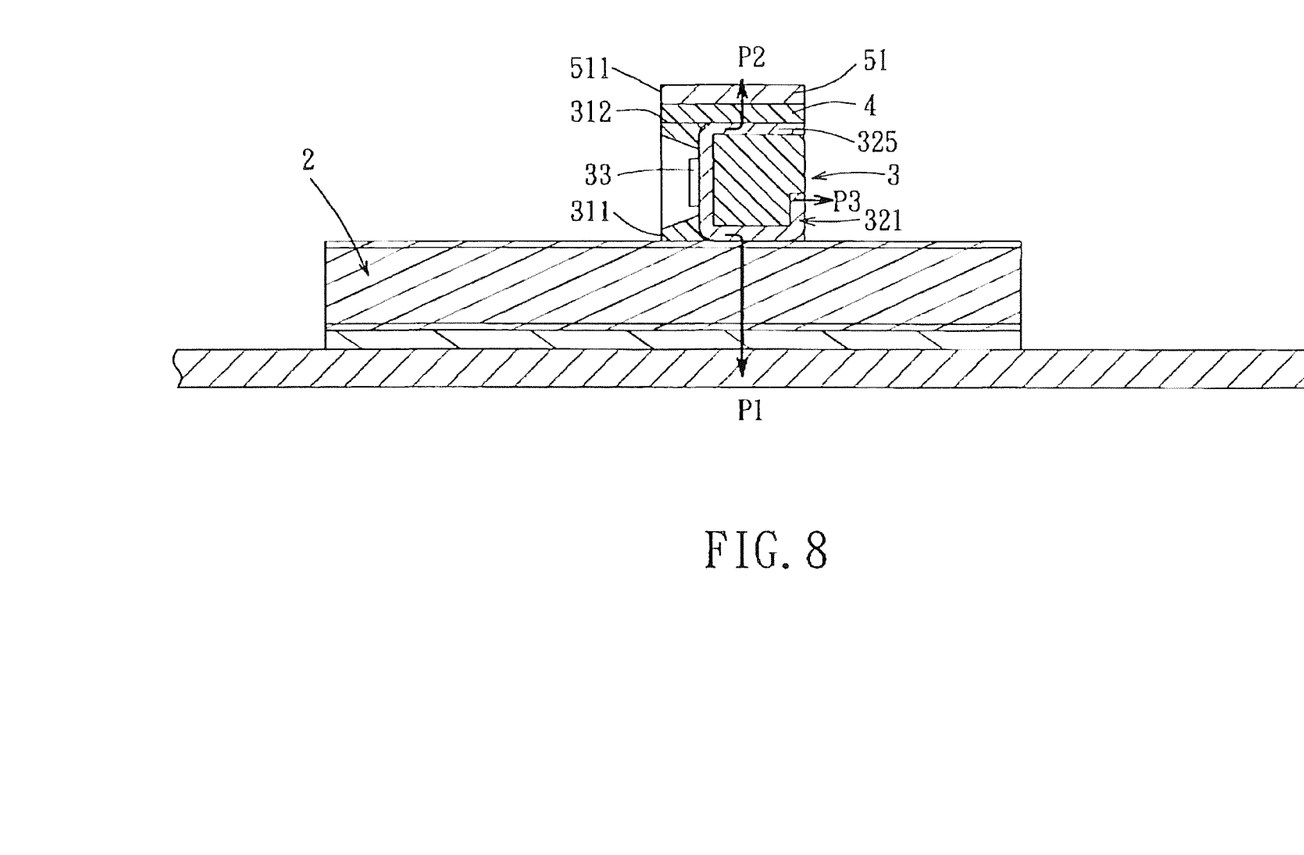
FIG. 8 is a sectional view of the second preferred embodiment in an assembled state.

Referring to FIGS. 7 and 8, a light source device 101 of a backlight module according to the second preferred embodiment of this invention is shown to be similar to the first preferred embodiment. The difference between the first and second preferred embodiments resides in the structure of the casing part. In this embodiment, the back frame unit is provided with two casing parts 5 (only one is shown in FIG. 7) disposed in positions corresponding to the first and second LED package structures 3, 3' (see FIG. 2). The first and second LED package structures 3, 3' are similarly soldered fixedly to the circuit board unit 2 using solder paste.

Taking for example the casing part 5 that corresponds to the first LED package structure 3, the casing part 5 has a generally inverted U-shaped configuration, and includes two spaced-apart side plates 52 extending respectively and transversely from two opposite sides of the first plate 51 and mounted fixedly to the circuit board unit 2 so that the first LED package structure 3 is disposed between the circuit board unit 2 and the first plate 51. The first plate 51 has a plate edge 511 disposed at the same side of the light-emitting surface 311 of the first LED package structure 3. The thermal pad 4 is sandwiched between the exposed second side portions 325 of the lead frames 321 and the first plate 51, and contacts directly both the second side portions 325 of the lead frames 321 and the first plate 51 of the casing part 5. The side plates 52 abut respectively against two opposite lateral surfaces 315 of the package body 31 of the first LED package structure 3. To fix the casing part 5 on the circuit board unit 2, the circuit board unit 2 is provided with two insertion slots 21 to receive respectively the two side plates 52 of the casing part 5. Moreover, by inserting the side plates 52 respectively into the insertion slots 21 in the circuit board unit 2 and by positioning the first LED package structure 3 and the thermal pad 4 between the casing part 5 and the circuit board unit 2, accurate positioning of the first LED package structure 3 can be enhanced. When the casing part 5 and the first LED package structure 3 are connected to the circuit board unit 2 and the thermal pad 4 is sandwiched between the casing part 5 and the first LED package structure 3, it is preferable that the plate edge 511 of the first plate 51 and the thermal pad 4 does not extend beyond the light-emitting surface 311 of the first LED package structure 3 so as to prevent the first plate 51 and the thermal pad 4 from blocking light emitted from the first LED package structure 3.

Since the first plate 51 of the casing part 5 is in direct contact with the thermal pad 4, and the thermal pad 4, in turn, is in direct contact with the second side portions 325 of the lead frames 321, therefore, when hear generated by the LED chips 33 is transmitted from the second side portions 325 of the lead frames 321 through the thermal pad 4 to the first plate 51, heat not only is dissipated directly through the first plate 51, part of the heat from the first plate 51 can also be transmitted toward the side plates 52 and be dissipated directly through the side plates 52 or other heat-conductive medium, thereby increasing the heat-conducting paths.

Figure 9:
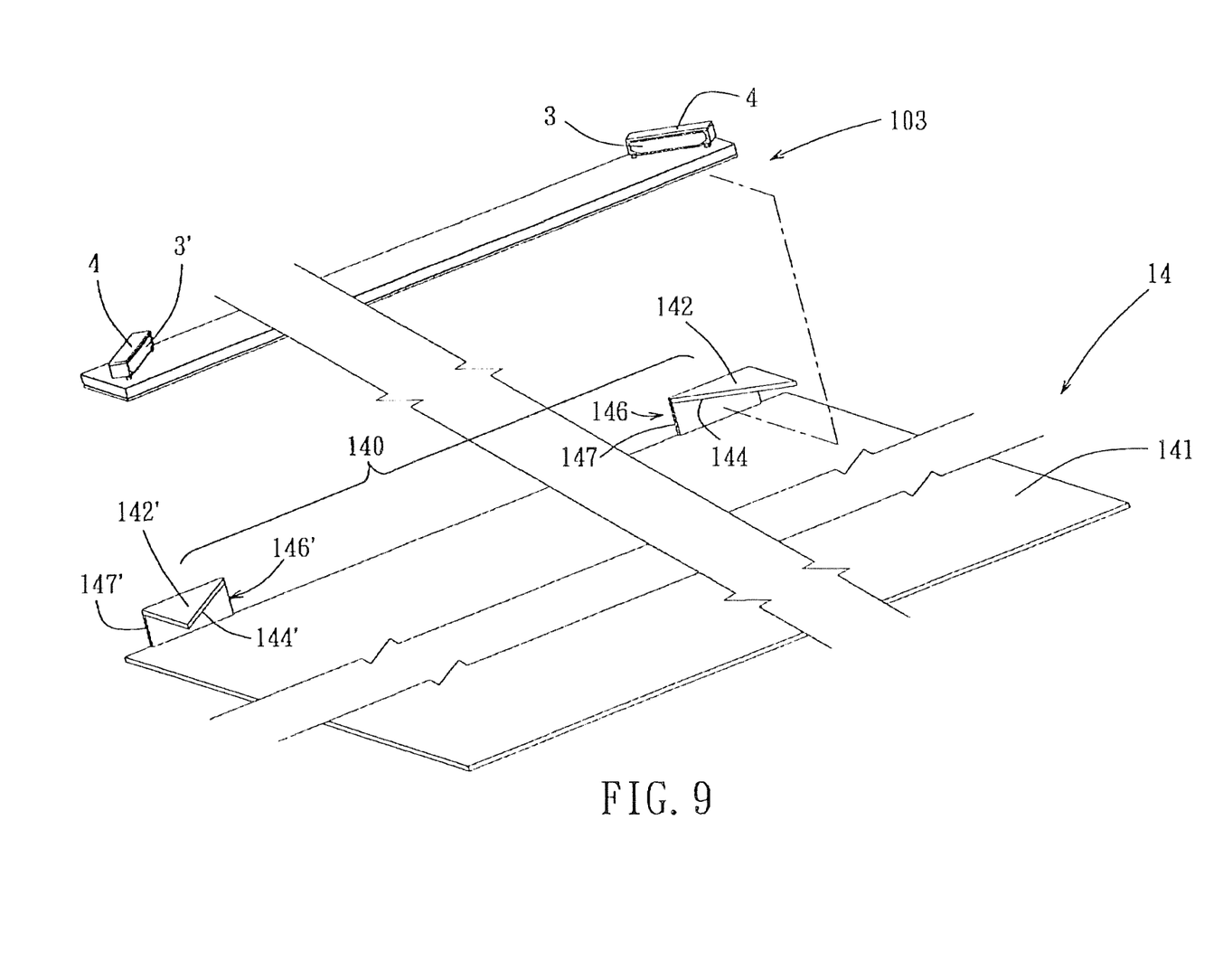
FIG. 9 is a fragmentary partially exploded perspective view of a light source device of a backlight module according to the third preferred embodiment of the present invention.
Figure 10:
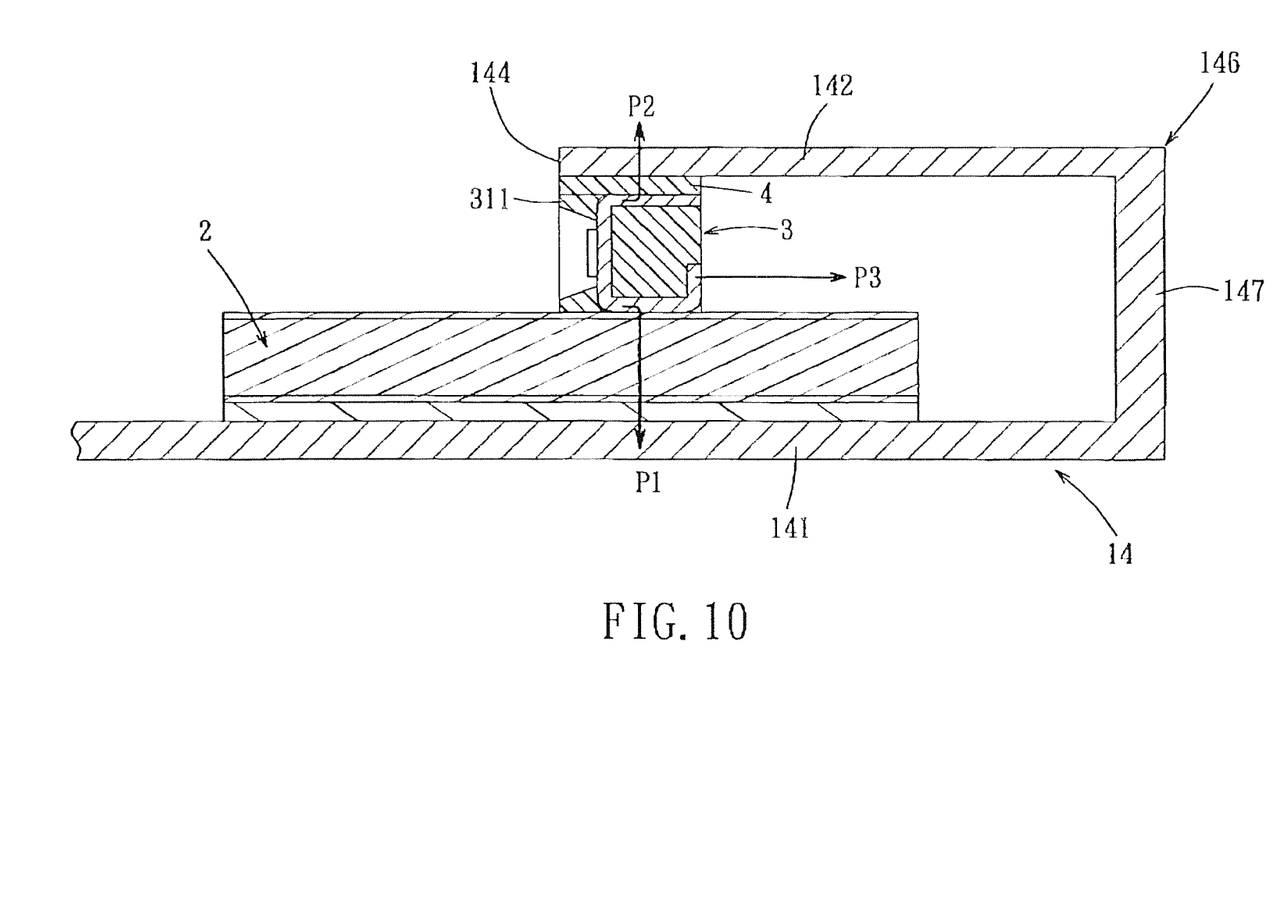
FIG. 10 is a sectional view of the third preferred embodiment in an assembled state.

Referring to FIGS. 9 and 10, a light source device 103 of a backlight module according to the third preferred embodiment of this invention is shown to be similar to the first preferred embodiment. The difference between the first and third preferred embodiments resides in the structure of the back frame unit. In this embodiment, the back frame unit 14 of the light source device 103 is made by stamping a metal plate. Apart from stamping to form the base plate 141, the metal plate is also stamped to form two spaced-apart protruding plates 146, 146' connected to the base plate 141. Each protruding plate 146, 146' is bent first relative to the base plate 141 to form the connecting plate 147, 147', after which a second bent is performed relative to the connecting plate 147, 147' to form the first or second plate 142, 142'. Hence, the casing part 140 is formed. The first and second LED package structures 3, 3' are respectively disposed between the base plate 141 and the first plate 142 and between the base plate 141 and the second plate 142', and are similarly soldered fixedly to the circuit board unit 2 using solder paste.

Taking the first LED package structure 3 as an example, the thermal pad 4 can similarly be disposed between the first plate 142 and the first LED package structure 3 so that the thermal pad 4 contacts directly both the first plate 142 and the first LED package structure 3. Alternatively, other component(s) may be disposed between the thermal pad 4 and the first LED package structure 3. The dispositional direction of the first plate 142 and the first LED package structure 3 and the dispositional direction of the second plate 142' and the second LED package structure 3' are similar to that described in the first preferred embodiment. Further, the slanting side 144 of the first plate 142 and the slanting side 144' of the second plate 142' are angled at 95°. However, the angular range of the slanting sides 144, 144' of the first and second plates 142, 142' may be similar to that of the first preferred embodiment. In other embodiments, the back frame unit 14 may be similar to the back frame of the conventional backlight module, and can be used for receiving an elongated type LED light source (that is, including a plurality of LED package structures).

Similarly, it is preferable that the first plate 142 and the thermal pad 4 do not extend beyond the light-emitting surface 311 of the first LED package structure 3 so as to prevent the first plate 142 and the thermal pad 4 from blocking light emitted from the first LED package structure 3. Moreover, in other embodiments, the casing part 140 of the back frame unit 14 may be configured as an elongated portion that extends out from a lateral edge of the base plate 141 and that is bent to form an elongated groove. That is, the two protruding plates 146, 146' are extended toward each other and are connected to each other to form a single elongated plate which is bent twice to form the casing part 140.

Figure 11:
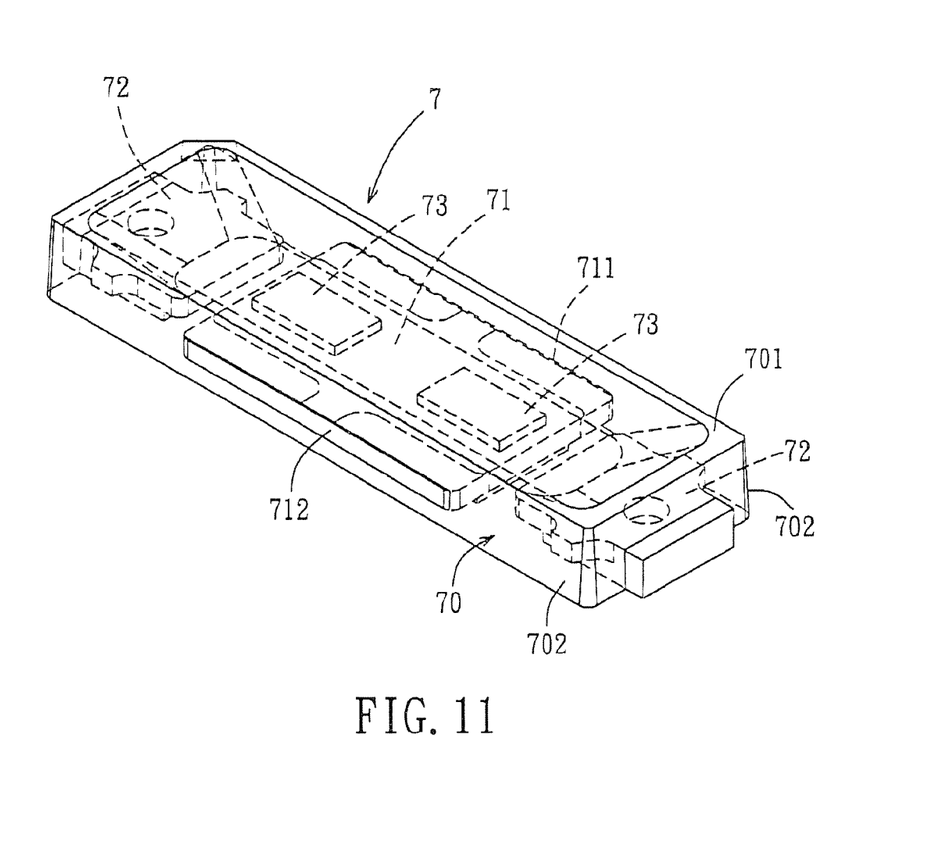
FIG. 11 is a perspective view of an LED package structure of a light source device of a backlight module according to the fourth preferred embodiment of the present invention.
Figure 12:
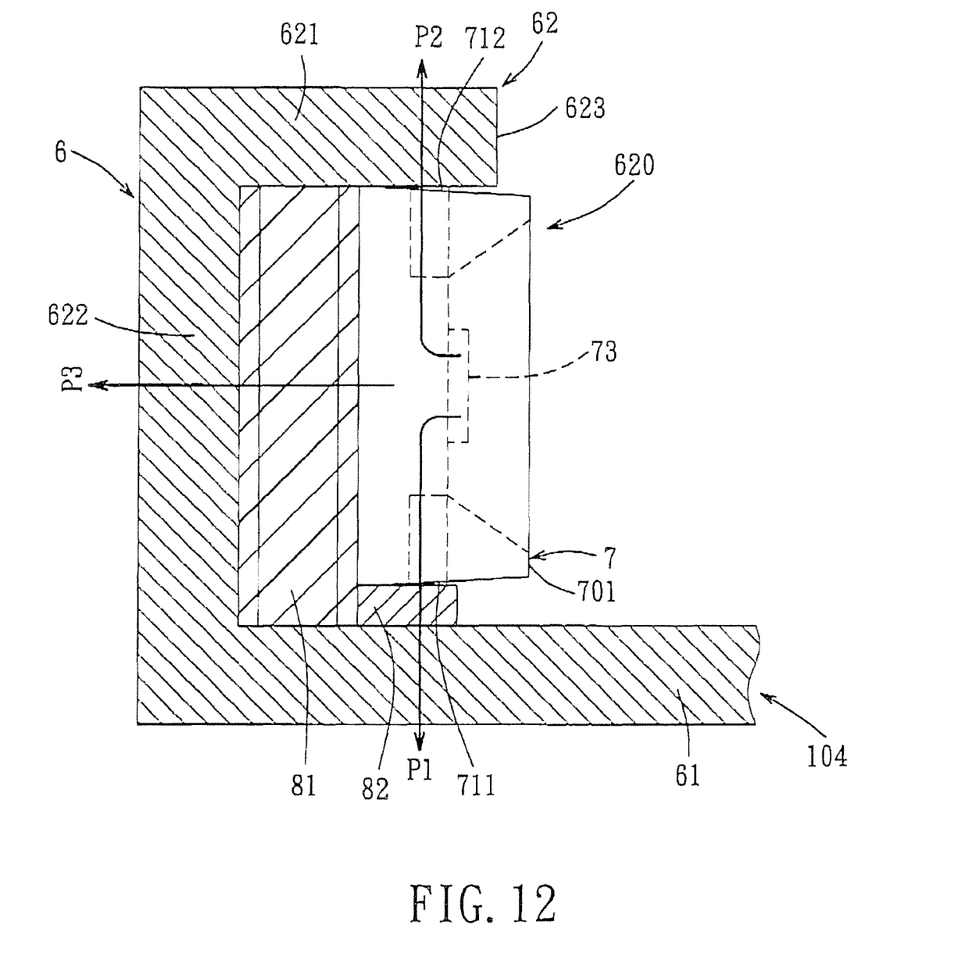
FIG. 12 is a fragmentary partially sectional view of the light source device of the backlight module of the fourth preferred embodiment.

Referring to FIGS. 11 and 12, a light source device 104 of a backlight module according to the fourth preferred embodiment of this invention is shown to comprise a back frame unit 6, an LED package structure 7, a circuit board unit 81, and a thermal pad 82. The back frame unit 6 includes a base plate 61, and a casing part 62 mounted on the base plate 61. The casing part 62 has a generally inverted L-shaped cross section, and includes a first plate 621 spaced apart from and parallel to the base plate 61, and a connecting plate 622 connecting one end of the first plate 621 to a corresponding end of the base plate 61. The first plate 621 has a plate edge 623 that cooperates with the base plate 61 to define an opening 620.

The LED package structure 7, in this embodiment, is elongated, and includes a package body 70 having a light-emitting surface 701 and two opposite first lateral surfaces 702, a lead frame 71 packaged by the package body 70, two frame bodies 72 disposed on two opposite sides of the lead frame 71, and two spaced-apart LED chips 73 disposed on the lead frame 71. The lead frame 71 is rectangular, and has opposite first and second sides 711, 712 respectively exposed from the first lateral surfaces 702 of the package body 70. The exposed second side 712 contacts directly the first plate 621. The LED package structure 7 is soldered fixedly to the circuit board unit 81. The LED package structure 7 and the circuit board unit 2 are disposed in the casing part 62 between the base plate 61 and the first plate 621. The circuit board unit 81 is adjacent to the connecting plate 622. The light-emitting surface 701 of the LED package structure 7 is parallel to a plane where the circuit board unit 81 is situated. When the LED package structure 7 is disposed in the casing part 62, it is preferable that the plate edge 623 of the first plate 621 does not extend beyond the light-emitting surface 701 so as to ensure that the plate edge 623 of the first plate 621 will not block the light emitted from the first LED package structure 3.

The thermal pad 82, in this embodiment, is disposed between and is in direct contact with both the exposed first side 711 of the lead frame 71 and the base plate 61. A first heat-conducting path (P1) is formed from the first side 711 through the thermal pad 82 to the base plate 61. A second heat-conducting path (P2) is formed from the exposed second side 712 of the lead frame 71 to the first plate 621. A third heat-conducting path (P3) is formed from a bottom side of the lead frame 71 through the circuit board unit 81 to the connecting plate 622.

Hence, in the fourth preferred embodiment, apart from direct contact of the second side 712 of the lead frame 71 with the first plate 621 to form the second heat-conducting path (P2) for heat dissipation, the LED package structure 7 further dissipates heat through the first heat-conducting path (P1) formed by the first side 711 of the lead frame 71, the thermal pad 82, and the base plate 61, thereby increasing the heat-conducting paths of the LED package structure 7.

In summary, through the structural improvement of the lead frame units 32 of the first and second LED package structures 3, 3', 7 and/or the casing part 12, 5, 62, 140 of the back frame unit 1, 14, 6 in cooperation with the thermal pads 4, 22, a plurality of heat-conducting paths can be formed when the first and second LED package structures 3, 3', 7 are mounted on the back frame unit 1, 14, 6, thereby enhancing the heat dissipation effect of the LED chips 3, 73. The object of this invention can thus be realized.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light source device of a backlight module comprising:
   a back frame unit including a thermal conductive base plate and a casing part disposed on said base plate, said casing part including a first plate spaced apart by a gap-from and overhanging a portion of said base plate; and
   a first LED package structure having a thermal pad applied thereto to fill the gap, said first LED package structure being thereby disposed in thermally conductive contact with both said base plate and said first plate, said first LED package structure comprising:
      a package body having a light-emitting surface and two first lateral surfaces connected respectively to two opposite sides of said light-emitting surface and respectively facing said base plate and said first plate, and
      a lead frame unit including at least one lead frame packaged by said package body, said lead frame being partially exposed from said first lateral surfaces of said package body to form a first heat-conduction contact path with said base plate and to form a second heat-conduction contact path with said first plate;

wherein a plate edge of said first plate extends over said package body, while the plate edge of the first plate not extending beyond the light emitting surface of the first LED package body.

2. The light source device as claimed in claim 1, wherein said second heat-conduction contact path passes through said thermal pad towards said first plate.

3. The light source device as claimed in claim 2, wherein said thermal pad contacts directly both of said second side portion of said lead frame and said first plate.

4. The light source device as claimed in claim 2, wherein said circuit board unit has a portion extending between said base plate and said first plate, said casing part further including two spaced-apart side plates extending respectively and transversely from two opposite sides of said first plate and mounted fixedly to said circuit board unit, said first LED package structure thereby disposed between said circuit board unit and said first plate.

5. The light source device as claimed in claim 2, wherein said casing part further includes a second plate spaced apart from said base plate, each of said first and second plates being formed by a metal plate projecting from said base plate, said metal plate being bent relative to said base plate to form said first or second plate, said light source device further comprising a second LED package structure disposed between said base plate and said second plate.

6. The light source device as claimed in claim 2, wherein said casing part further includes a connecting plate connecting said first plate to said base plate.

7. The light source device as claimed in claim 6, wherein said first plate has a slanting side cooperating with said base plate to define an opening, said light-emitting surface of said package body facing said opening, said slanting side not extending beyond said light-emitting surface of said package body.

8. The light source device as claimed in claim 7, wherein said connecting plate is configured as a rectangular loop, and includes a pair of first connecting sides and a pair of second connecting sides connected between said first connecting sides, said first plate being disposed at a corner between one of said first connecting sides and one of said second connecting sides, said slanting side of said first plate forming an angle ranging from 30° to 90° with respect to said one of said second connecting sides.

9. The light source device as claimed in claim 8, wherein said slanting side of said first plate forms an angle of 45° with respect to said one of said first connecting sides and with respect to said one of said second connecting sides.

10. The light source device as claimed in claim 8, wherein said casing part further includes a second plate disposed at a corner between said one of said first connecting sides and the other one of said second connecting sides, said second plate having a slanting side forming an angle ranging from 30° to 90° with respect to said other one of said second connecting sides, said light source device further comprising a second LED package structure disposed between said base plate and said second plate, said second LED package structure having a light-emitting surface, said slanting side of said second plate not extending beyond said light-emitting surface of said second LED package structure.

11. The light source device as claimed in claim 10, wherein said slanting side of said second plate forms an angle of 45° with respect to said one of said first connecting sides and with respect to said other one of said second connecting sides.

12. The light source device as claimed in claim 1, wherein said thermal pad is provided between said first side portion of said lead frame and said base plate and contacts directly both of said first side portion of said lead frame and said base plate, said second side portion of said lead frame contacting directly said first plate, said first heat-conduction contact path passing through said thermal pad.

13. An LED package structure configured to be mounted between a base plate and a first plate of a light source device, the first plate being spaced apart from and overhanging a portion of said the base plate, said LED package structure comprising:

a package body having a light-emitting surface and two opposite first lateral surfaces, said light-emitting surface being formed with an encapsulant cavity;

a lead frame unit including at least one lead frame packaged by said package body, said lead frame including a chip-mounting portion, and a first side portion and a second side portion respectively extending from two opposite sides of said chip-mounting portion, said first and second side portions being partially exposed from said first lateral surfaces of said package body, respectively, said first side portion of said lead frame configured to directly contact the circuit board to form a first heat-conduction contact path with the base plate an LED chip mounted fixedly to said lead frame and disposed in said encapsulant cavity; and a thermal pad having a silicone rubber composition directly contacting said second side portion of said lead frame to complete a second heat-conduction contact-path with the first plate.

14. The LED package structure as claimed in claim 13, wherein said lead frame further includes a flange extending from said first side portion toward said second side portion and spaced apart from said chip-mounting portion, said package body further having a second lateral surface opposite to said light-emitting surface, said flange being exposed from said second lateral surface and forming a third heat-conducting path.

15. The LED package structure as claimed in claim 13, wherein said first side portion of said lead frame is configured to be soldered fixedly to the circuit board unit, said first heat-conduction contact path being configured to pass through the circuit board unit, said light-emitting surface being configured to be disposed perpendicular to the circuit board unit.

16. The LED package structure as claimed in claim 13, wherein said light-emitting surface is configured to be disposed parallel to the circuit board unit.

17. An LED package structure configured to be mounted between a base plate and a first plate of a light source device, the first plate being spaced apart from the base plate, said LED package structure comprising:

a package body having a light-emitting surface and two opposite first lateral surfaces, said light-emitting surface being formed with an encapsulant cavity;

a lead frame unit including at least one lead frame packaged by said package body, said lead frame including a chip-mounting portion, and a first side portion and a second side portion respectively extending from two opposite sides of said chip-mounting portion, said first and second side portions being partially exposed from said first lateral surfaces of said package body, respectively, said first side portion of said lead frame configured to directly contact the circuit board unit to form a first heat-conduction contact path with the base plate
an LED chip mounted fixedly to said lead frame and disposed in said encapsulant cavity; and
a thermal pad having a silicone rubber composition directly contacting said second side portion of said lead frame to complete a second heat-conduction contact-path with the first plate;
wherein said light-emitting surface of said package body is configured to face an opening defined cooperatively by a slanting side of the first plate and the base plate.

* * * * *